(12) United States Patent
Haiberger et al.

(10) Patent No.: US 10,230,031 B2
(45) Date of Patent: Mar. 12, 2019

(54) ELECTROMAGNETIC RADIATION-EMITTING ASSEMBLY

(71) Applicant: OSRAM Opto Semiconductors GmbH, Regensburg (DE)

(72) Inventors: Luca Haiberger, Regensburg (DE); Sam Chou, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/557,564

(22) PCT Filed: Mar. 16, 2016

(86) PCT No.: PCT/EP2016/055686
§ 371 (c)(1),
(2) Date: Sep. 12, 2017

(87) PCT Pub. No.: WO2016/146681
PCT Pub. Date: Sep. 22, 2016

(65) Prior Publication Data
US 2018/0062051 A1    Mar. 1, 2018

(30) Foreign Application Priority Data
Mar. 16, 2015 (DE) .................. 10 2015 103 840

(51) Int. Cl.
*H01L 33/60* (2010.01)
*H01L 33/10* (2010.01)
*H01L 33/50* (2010.01)
*H01L 33/54* (2010.01)
*H01L 33/48* (2010.01)
*H01L 33/62* (2010.01)
*H01L 33/46* (2010.01)
(Continued)

(52) U.S. Cl.
CPC .............. *H01L 33/60* (2013.01); *H01L 33/10* (2013.01); *H01L 33/486* (2013.01); (Continued)

(58) Field of Classification Search
CPC ....... H01L 33/60; H01L 33/50; H01L 33/504; H01L 33/54; H01L 33/10
See application file for complete search history.

(56) References Cited

U.S. PATENT DOCUMENTS

2002/0190262 A1* 12/2002 Nitta ................... H01L 25/0753
257/99
2006/0198162 A1* 9/2006 Ishidu .................... H01L 33/60
362/623
(Continued)

FOREIGN PATENT DOCUMENTS

EP          2479233 A1      7/2012

*Primary Examiner* — Fei Fei Yeung Lopez
(74) *Attorney, Agent, or Firm* — Slater Matsil, LLP

(57) ABSTRACT

An electromagnetic radiation-emitting assembly is disclosed. In an embodiment the assembly includes an electromagnetic radiation-emitting component arranged above a carrier, the electromagnetic radiation-emitting component including a first side facing away from the carrier, a second side facing the carrier, and at least one side wall connecting the first side and the second side of the electromagnetic radiation-emitting component to one another, an encapsulating body, into which the electromagnetic radiation-emitting component is embedded, which adjoins the first side and the side wall of the electromagnetic radiation-emitting component, a potting material at least partly surrounding the encapsulating body and a reflector body at least partly surrounding the potting material.

15 Claims, 3 Drawing Sheets

(51) Int. Cl.
*H01L 27/32* (2006.01)
*H01L 51/52* (2006.01)

(52) U.S. Cl.
CPC ............ *H01L 33/504* (2013.01); *H01L 33/54* (2013.01); *H01L 33/62* (2013.01); *H01L 27/322* (2013.01); *H01L 33/46* (2013.01); *H01L 51/5237* (2013.01); *H01L 51/5268* (2013.01); *H01L 51/5271* (2013.01); *H01L 2224/48091* (2013.01); *H01L 2224/73265* (2013.01); *H01L 2933/0091* (2013.01)

(56) References Cited

U.S. PATENT DOCUMENTS

| | | | |
|---|---|---|---|
| 2009/0267096 A1* | 10/2009 | Kim | H01L 33/0079 257/98 |
| 2009/0315048 A1* | 12/2009 | Fehrer | H01L 33/20 257/98 |
| 2010/0163914 A1* | 7/2010 | Urano | H01L 33/507 257/98 |
| 2010/0321920 A1* | 12/2010 | Wu | H01L 33/54 362/84 |
| 2011/0309405 A1* | 12/2011 | Lee | H01L 33/486 257/99 |
| 2012/0025243 A1* | 2/2012 | Lin | H01L 33/54 257/98 |
| 2013/0341666 A1 | 12/2013 | Yoshida et al. | |
| 2014/0252943 A1 | 9/2014 | Chan et al. | |
| 2016/0027975 A1* | 1/2016 | Kitamura | H01L 33/56 438/27 |
| 2017/0018692 A1* | 1/2017 | Oh | H01L 33/504 |

\* cited by examiner

ELECTROMAGNETIC RADIATION-EMITTING ASSEMBLY

This patent application is a national phase filing under section 371 of PCT/EP2016/055686, filed Mar. 16, 2016, which claims the priority of German patent application 10 2015 103 840.4, filed Mar. 16, 2015, each of which is incorporated herein by reference in its entirety.

TECHNICAL FIELD

The invention relates to an electromagnetic radiation-emitting assembly.

BACKGROUND

In a conventional electromagnetic radiation-emitting assembly, which is also referred to as assembly for short hereinafter, an electromagnetic radiation-emitting component, which is also referred to as component for short hereinafter, is embedded into a potting material and a reflective material. The reflective material adjoins the component, in particular side walls of the component, in a lateral direction, that is to say parallel to a carrier on which the component is arranged. The potting material adjoins a first side of the component facing away from the carrier.

If the component is configured as a surface emitter, then the component emits the electromagnetic radiation into the potting material, which may guide at least part of the electromagnetic radiation in a direction toward the reflective material. If the component is configured as a volume emitter, then the component emits the electromagnetic radiation in all directions, in particular toward the carrier, into the potting material and in a lateral direction via the side walls in a direction toward the reflective material, such that said electromagnetic radiation is reflected back again into the component. In this way, the electromagnetic radiation may be multiply reflected by the reflective material, as a result of which the efficiency of the assembly deteriorates and the reflective material undergoes rapid wear. Furthermore, the electromagnetic radiation may be multiply reflected in a direction toward the carrier, as a result of which the latter undergoes rapid wear. The lifetime of the assembly may be shortened as a result.

Moreover, during the production process, the reflective material, still in a liquid or at least viscous state, on account of surface effects, may creep along the side walls of the component and even cover regions of the first side of the component, as a result of which the efficiency of the assembly is impaired.

SUMMARY OF THE INVENTION

In various embodiments, an electromagnetic radiation-emitting component is provided which is producible simply and expediently and/or has a high efficiency and/or long lifetime.

In various embodiments an electromagnetic radiation-emitting assembly is provided. The assembly comprises a carrier and an electromagnetic radiation-emitting component, which is arranged above the carrier. The electromagnetic radiation-emitting component comprises a first side facing away from the carrier, a second side facing the carrier and at least one side wall which connects the first side and the second side of the electromagnetic radiation-emitting component to one another. An encapsulating body, into which the electromagnetic radiation-emitting component is embedded adjoins the first side and the side wall of the electromagnetic radiation-emitting component. The encapsulating body is configured such that electromagnetic radiation generated with the aid of the electromagnetic radiation-emitting component passes through the encapsulating body. A potting material at least partly surrounds the encapsulating body. The potting material is configured such that electromagnetic radiation generated with the aid of the electromagnetic radiation-emitting component passes through the potting material. A reflector body, which surrounds the potting material, is configured such that it reflects electromagnetic radiation generated with the aid of the electromagnetic radiation-emitting component.

The electromagnetic radiation-emitting assembly is also referred to as assembly hereinafter. The electromagnetic radiation-emitting component is also referred to as component hereinafter. The electromagnetic radiation is also referred to as radiation hereinafter.

Embedding the component into the encapsulating body, in particular such that at least one side wall adjoins the encapsulating body, has the effect that the radiation generated by the component may emerge from the component laterally, that is to say at the at least one side wall. The encapsulating body may be configured, for example, as transparent, substantially transparent or translucent. The radiation that has emerged laterally from the component may then impinge on the reflective material and be reflected. A probability of the radiation being reflected back into the component and/or onto the carrier is lower here than in the case of a conventional assembly in which the reflective material directly adjoins the side wall of the component. As a result, compared with a conventional assembly, wear of the assembly may be reduced and the lifetime may be lengthened in a simple and expedient manner. Furthermore, the reflective material does not adjoin the component, but rather the encapsulating body, and the material of the encapsulating body may be chosen such that, during the production method, the reflective material may not creep along the encapsulating body and cover the side wall and/or the first side of the component. This may contribute to a high efficiency of the assembly.

The electromagnetic radiation generated with the aid of the component may be electromagnetic radiation which is generated directly in the component and which may be referred to as excitation radiation in various embodiments, or may be electromagnetic radiation which is generated on the basis of the radiation generated by the component and which may be referred to as conversion radiation in various embodiments. The conversion radiation may be, for example, radiation which is emitted by phosphors, which were excited with the aid of the excitation radiation.

In addition to said one side wall the component may comprise a second, third and/or fourth side wall which connect the first side of the component to the second side of the component and are adjoined by the encapsulating body. By way of example, the component may adjoin the encapsulating body at all sides and side walls apart from the second side. The fact that the assembly is provided may mean, for example, that the assembly is formed. The carrier may, for example, be a substrate, a leadframe or a circuit board and/or comprise ceramic, metal, plastic and/or a semiconductor material. The component may, for example, be a volume emitter and/or be based on a sapphire chip or a SiC chip. The electromagnetic radiation may be, for example, light, for example, blue light.

In one embodiment, at least one section of the encapsulating body adjoins a barrier body in a lateral direction toward the outside, wherein the barrier body comprises in particular a smaller height than the encapsulating body. As a result, a more precise shape of the encapsulating body is made possible and, in addition, the electromagnetic radiation is shaded by the low barrier body to a small extent or not at all. The height of the barrier body may be less than 50%, in particular less than 10%, of the height of the encapsulating body. In one embodiment, a circumferential side face of the encapsulating body laterally adjoins the barrier body extending circumferentially around the component. As a result, the areal shape of the encapsulating body is defined more precisely by the barrier body.

In one embodiment, the barrier body laterally circumferentially adjoins the component and/or the mirror layer and covers at least one partial area of the surface of the carrier which extends circumferentially around the component in a ring-shaped fashion. As a result, a lateral extent of the encapsulating body is limited to the component or the mirror layer. As a result, material for the encapsulating body is limited. In addition, the carrier adjoining the component or the encapsulating body is covered and protected by the barrier body.

In one embodiment, the reflector body adjoins the barrier body at least laterally from outside. In addition, the reflector body may laterally overlap the barrier body at least partly from outside. Furthermore, the reflector body may be led from outside over the barrier body as far as the encapsulating body. Good emission properties of the assembly are achieved with these embodiments.

In various embodiments the assembly comprises a mirror layer. The mirror layer is arranged between the electromagnetic radiation-emitting component and the carrier. The mirror layer is configured such that it reflects electromagnetic radiation generated with the aid of the electromagnetic radiation-emitting component in a direction away from the carrier. The mirror layer thus contributes to the fact that little or no radiation at all impinges on the carrier. Consequently, the mirror layer contributes to the fact that the assembly undergoes little wear and has a long lifetime. Furthermore, the mirror layer may contribute to the fact that more radiation may be coupled out from the assembly, as a result of which the efficiency of the assembly is improved.

In various embodiments, the mirror layer is formed by a reflective adhesion-medium layer by means of which the electromagnetic radiation-emitting component is secured on the carrier. In other words, the adhesion-medium layer for securing the component on the carrier may be configured in a reflective fashion, and thus serve as a mirror layer. The adhesion-medium layer may comprise, for example, an adhesive carrier material with reflective particles embedded therein. The adhesion-medium layer may comprise, for example, adhesive, resin, silicone and/or solder. The reflective particles may comprise, for example, $TiO_2$ or cristobalite.

In various embodiments the encapsulating body comprises a first carrier material and a first filling material. The first filling material is embedded into the first carrier material. The first carrier material may comprise, for example, silicone or epoxy resin. The first carrier material may be configured, for example, as transparent, substantially transparent or translucent. Alternatively or additionally, the encapsulating body may comprise a material comprising a high refractive index.

In various embodiments the first filling material comprises phosphor. The phosphor may serve for converting the excitation radiation and for generating the conversion radiation. In other words, the encapsulating body may be configured as a conversion element for converting the radiation with regard to the wavelength thereof.

In various embodiments the potting material comprises a second carrier material and a second filling material. The second filling material is embedded into the second carrier material. The second carrier material may comprise, for example, silicone or epoxy resin. The second carrier material may be configured, for example, as transparent, substantially transparent or translucent. Alternatively or additionally, the potting material may comprise a low refractive index, for example, one lower than the material of the encapsulating body.

In various embodiments the second filling material comprises phosphor. In other words, the potting material may be configured as a conversion element for converting the radiation with regard to the wavelength thereof.

In various embodiments a minimum distance between the side wall of the component and the potting material is in a range of between 10 μm and 1 mm and/or between 100 μm and 500 μm, for example, approximately 300 μm. This may contribute to the fact that enough radiation may emerge laterally from the component and, as a result, the lifetime of the assembly may be lengthened, wear may be reduced and the efficiency may be improved.

In various embodiments the encapsulating body is configured in a domed fashion. In other words, the encapsulating body may be configured in a hemispherical or dome-shaped fashion. This may contribute to the fact that the assembly is particularly efficient.

In various embodiments at least one section of the encapsulating body adjoins a barrier body in a lateral direction. The section may be, for example, a section of the encapsulating body which adjoins the carrier or, if appropriate, the mirror layer. The barrier body may be formed, for example, on the carrier or the mirror layer. As an alternative thereto, the barrier body may be formed by the carrier or the mirror layer. The barrier body may extend, for example, in a frame-shaped fashion or in a ring-shaped fashion around the component and/or the encapsulating body. The carrier body makes it possible to apply the material of the encapsulating body in a liquid or viscous state on the carrier or the mirror layer within the barrier body, without the material of the encapsulating body flowing over the barrier body and thus remaining in the region provided therefor within the barrier body.

In various embodiments the barrier body comprises a reflective material. The reflective material may be embedded, for example, into the barrier body. Alternatively or additionally, the barrier body may be coated with the reflective material and/or be formed by the latter. The reflective material may be, for example, $TiO_2$ or cristobalite.

In various embodiments the electromagnetic radiation-emitting component is a volume emitter. The volume emitter is a radiation-emitting chip. In the case of the volume emitter, the radiation is generated inter alia in the volume formed by the substrate of the chip and is emitted via the first side and the side walls of the component. The volume emitter is, for example, a sapphire-based chip.

In various embodiments the encapsulating body is coated with an encapsulating body layer. The encapsulating body layer may be applied on the encapsulating body, for example, before the process of arranging the potting material, by means of dispensing, in particular jet dispensing, printing or spraying. Alternatively or additionally, the material of the encapsulating body layer may be introduced into the potting material and may settle and sediment after the process of arranging the potting material on the encapsulating body.

In various embodiments the electromagnetic radiation-emitting component is coated with a component layer.

In various embodiments the encapsulating body layer and/or the component layer comprise(s) phosphor.

BRIEF DESCRIPTION OF THE DRAWINGS

Exemplary embodiments of the invention are illustrated in the figures and are explained in greater detail below.

In the figures.

DETAILED DESCRIPTION OF ILLUSTRATIVE EMBODIMENTS

Figure 1:
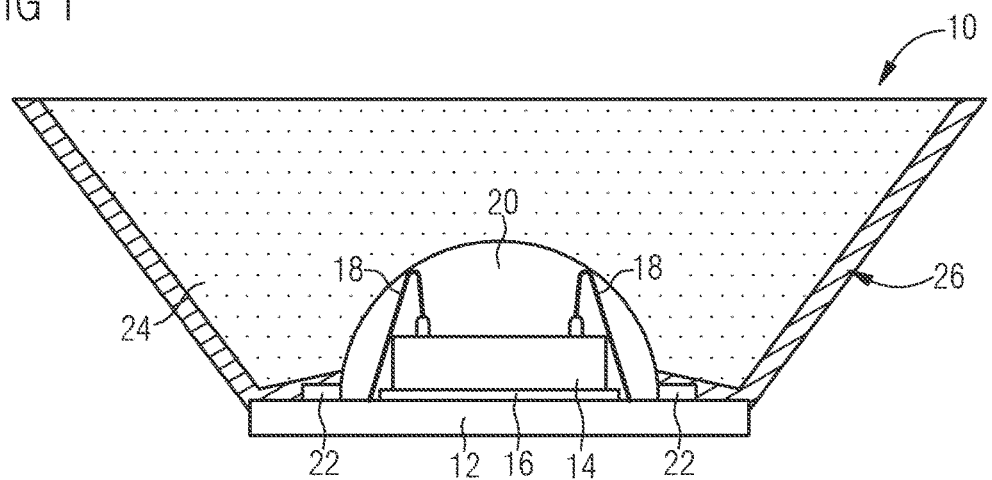
FIG. 1 shows one exemplary embodiment of an electromagnetic radiation-emitting assembly.

In the following detailed description reference is made to the accompanying drawings, which form part of this description and show for illustrating purposes specific exemplary embodiments in which the invention may be implemented. In this regard, direction terminology such as, for instance, "at the top", "at the bottom", "at the front", "at the back", "front", "rear", etc. is used with respect to the orientation of the figure(s) described. Since component parts of exemplary embodiments may be positioned in a number of different orientations, the direction terminology serves for illustration and is not restrictive in any way whatsoever. It goes without saying that other exemplary embodiments may be used and structural or logical changes may be made, without departing from the scope of protection of the present invention. It goes without saying that the features of the various exemplary embodiments described herein may be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

An electromagnetic radiation-emitting assembly may comprise an electromagnetic radiation-emitting component and one, two or more optically functional bodies, materials and/or a housing. An optically functional body or an optically functional material may influence and/or direct or guide electromagnetic radiation. Influencing the electromagnetic radiation may comprise, for example, scattering, reflecting and/or converting the electromagnetic radiation. An electromagnetic radiation-emitting component may, for example, be an electromagnetic radiation-emitting semiconductor component and/or be configured as an electromagnetic radiation-emitting diode, as organic electromagnetic radiation-emitting diode, as an electromagnetic radiation-emitting transistor or as an organic electromagnetic radiation-emitting transistor. The radiation may be, for example, light in the visible range, UV light and/or infrared light. In this context, the electromagnetic radiation-emitting component may be configured, for example, as a light-emitting diode (LED), as an organic light-emitting diode (OLED), as a light-emitting transistor or as an organic light-emitting transistor. In various exemplary embodiments, the light-emitting component may be part of an integrated circuit. Furthermore, a plurality of light-emitting components may be provided in an electromagnetic radiation-emitting assembly, for example, in a manner accommodated in a common housing. In various exemplary embodiments, an optoelectronic component may be configured as a top and/or bottom emitter. A top and/or bottom emitter may also be referred to as an optically transparent component, for example, a transparent organic light-emitting diode.

The electromagnetic radiation-emitting assembly is also referred to as assembly hereinafter. The electromagnetic radiation-emitting component is also referred to as component hereinafter. The electromagnetic radiation is also referred to as radiation hereinafter.

In various exemplary embodiments, the term "translucent" or "translucent layer" may be understood to mean that a layer is transmissive to light, for example, to the light generated by the light-emitting component, for example, in one or a plurality of wavelength ranges, for example, to light in a wavelength range of visible light (for example, at least in a partial range of the wavelength range of 380 nm to 780 nm). By way of example, in various exemplary embodiments, the term "translucent layer" should be understood to mean that substantially the entire quantity of light coupled into a structure (for example, a layer) is also coupled out from the structure (for example, layer), wherein part of the light may be scattered in this case.

In various exemplary embodiments, the term "transparent" or "transparent layer" may be understood to mean that a layer is transmissive to light (for example, at least in a partial range of the wavelength range of 380 nm to 780 nm), wherein light coupled into a structure (for example, a layer) is also coupled out from the structure (for example, layer) substantially without scattering or light conversion.

In the case of a cohesive connection, the first body may be connected to the second body by means of atomic and/or molecular forces. Cohesive connections may often be non-releasable connections. In various configurations, a cohesive connection may be realized, for example, as an adhesive connection, a solder connection, for example, of a glass solder or of a metal solder, or as a welding connection.

FIG. 1 shows one exemplary embodiment of an electromagnetic radiation-emitting assembly 10. The assembly 10 comprises a carrier 12, an electromagnetic radiation-emitting component 14, an encapsulating body 20 and potting material 24. The component 14 is arranged above the carrier 12. The component 14 comprises a first side facing away from the carrier 12, a second side facing the carrier 12, and side walls which connect the first side to the second side. The component 14 is configured, for example, as a volume emitter. The volume emitter emits the radiation not only at the first side but also at the side walls of the volume emitter and at the second side of the component 14. In other words, the component 14 emits the radiation in a direction perpendicular to the surface of the carrier 12 and perpendicular to said direction, that is to say in a lateral direction. In this application, the lateral direction denotes a direction which is parallel to a surface of the carrier 12 on which the component 14 is arranged. The volume emitter may be, for example, a chip based on a sapphire substrate. The carrier 12 may comprise, for example, ceramic, metal, plastic, a semiconductor material and/or resin. The carrier 12 may be, for example, a leadframe, a circuit board and/or a substrate.

The component 14 is embedded into the encapsulating body 20, such that the first side of the component 14 and the side walls of the component 14 are in direct physical contact with the material of the encapsulating body 20. In other words, the encapsulating body 20 adjoins the side walls and the first side of the component 14. The material of the encapsulating body 20 may thus be referred to as optically functional material. The encapsulating body 20 may be configured, for example, as transparent or translucent, such that the radiation may emerge from the component 14 via the first side and the side walls of the component 14. Optionally, the encapsulating body 20 may comprise phosphor for converting radiation generated by means of the component 14. By way of example, the encapsulating body 20 may comprise a first carrier material, which may comprise silicone or resin, for example, and a first filling material, which may comprise phosphor, for example. The radiation generated by the component 14 and, if appropriate, the radiation generated by means of the component 14, for example, conversion radiation emitted by the phosphors, passes through the encapsulating body 20 and into the potting material 24.

The potting material 24 may be configured, for example, as transparent or translucent. Optionally, the potting material 24 may comprise phosphor. By way of example, the potting material 24 may comprise a second carrier material, which may comprise silicone or resin, for example, and a second filling material, which may comprise phosphor, for example.

Customary phosphors are, for example, garnets or nitrides silicates, nitrides, oxides, phosphates, borates, oxynitrides, sulfides, selenides, aluminates, tungstates, and halides of aluminum, silicon, magnesium, calcium, barium, strontium, zinc, cadmium, manganese, indium, tungsten and other transition metals, or rare earth metals such as yttrium, gadolinium or lanthanum, which are doped with an activator such as, for example, copper, silver, aluminum, manganese, zinc, tin, lead, cerium, terbium, titanium, antimony or europium. In various embodiments of the invention the phosphor is an oxidic or (oxy)nitridic phosphor such as a garnet, orthosilicate, nitrido(alumo)silicate, nitride or nitridoorthosilicate, or a halide or halophosphate. Specific examples of suitable phosphors are strontium chloroapatite:Eu ((Sr,Ca)$_5$(PO$_4$)$_3$Cl:Eu; SCAP), yttrium aluminum garnet:cerium (YAG:Ce) or CaAlSiN3:Eu. Furthermore, the phosphor or phosphor mixture may contain, for example, particles having light-scattering properties and/or auxiliaries. Examples of auxiliaries include surfactants and organic solvents. Examples of light-scattering particles are gold, silver and metal oxide particles.

The phosphors are energetically excited with the aid of the radiation generated by the component 14, which radiation may also be referred to as excitation radiation in this context. Upon subsequent energetic deexcitation, the phosphors emit light of one or a plurality of predefined colors. Consequently, a conversion of the excitation radiation takes place, as a result of which the conversion radiation is generated. During the conversion, the wavelengths of the excitation radiation are shifted to shorter or longer wavelengths. The colors may be individual colors or mixed colors. The individual colors may comprise green, red or yellow light, for example, and/or the mixed colors may be mixed from green, red and/or yellow light, for example, and/or comprise white light, for example. In addition, blue light may be provided, for example, by the encapsulating body 14 and/or the potting material 24 being configured in such a way that at least partly non-converted excitation radiation leaves the assembly 10 as usable illumination light. By way of example, green, red and yellow may be represented with the aid of blue light. With the use of UV light as excitation radiation, the phosphors may also be chosen in such a way that they represent red, green, blue and yellow.

A reflector body 26 surrounds the potting material 24 in a lateral direction. The reflector body 26 may be formed by a reflective layer, for example. The reflector body 26 may comprise silicone, for example, into which reflective particles, for example, TiO$_2$ and/or cristobalite, are embedded. The reflector body 26 may be arranged at least partly above the carrier 12 and/or above the barrier body 22 and extend as far as the encapsulating body 20. The encapsulating body 20 is preferably configured such that when the material of the reflector body 26 is applied, for example, in a viscous or liquid state, the material of the reflector body 26 does not creep along the encapsulating body 20 in a direction away from the carrier 12 on account of surface effects.

Optionally, a mirror layer 16 may be formed between the component 14 and the carrier 12. The mirror layer 16 serves for reflecting radiation which is generated by the component 14 and is emitted or reflected in a direction toward the mirror layer 16. The mirror layer 16 may be formed by an adhesion-medium layer, for example. The adhesion-medium layer serves to secure the component 14 on the carrier 12. The adhesion-medium layer 12 may secure the component 14 cohesively on the carrier 12. The mirror layer 16 may comprise a reflective material, for example, reflective particles, for example, SiO$_2$ and/or cristobalite, and a carrier material into which the reflective are embedded and which brings about the adhesive effect, for example.

The component 14 comprises electrical connections (not illustrated) for electrically contacting the component 14. By way of example, the component 14 may comprise on the first side of the component 14 two electrical connections which are electrically contacted with the aid of bond wires 18 with electrical contact pads (not illustrated) corresponding thereto on the carrier 12.

A barrier body 22 is arranged and/or formed on the carrier 12. The barrier body 22 extends around the encapsulating body 20, such that the encapsulating body 20 adjoins the barrier body 22 in a lateral direction in a region facing the carrier 12.

When producing the assembly 10, firstly the carrier 12 may be provided, for example, formed. The component 14 and, if appropriate, the mirror layer 16 may be formed on the carrier 12. By way of example, the component 14 may be arranged and/or secured on the carrier 12 by means of the mirror layer 16. Optionally, the barrier body 22 may be formed on the carrier 12. As an alternative thereto, the carrier 12 may be configured such that it comprises the barrier body 22. In other words, the barrier body 22 may be configured integrally with the carrier 12. Afterward, the component 14 may be electrically contacted with the aid of the bond wires 18.

The material of the encapsulating body 20 may be applied, for example, in a viscous or liquid state on the component 14 within the barrier body 22, wherein the barrier body 22 may prevent the material of the encapsulating body from passing beyond the barrier body 22. In other words, the barrier body 22 predefines a position and/or a shape of the encapsulating body 20 in a lateral direction. If the barrier body 22 is configured in a frame-shaped, rectangular or square fashion, for example, then a base of the encapsulating body 20 facing the carrier 12 may accordingly be configured in a rectangular or square fashion. If the barrier body 22 is configured in a ring-shaped, oval or circular fashion, for example, then a base of the encapsulating body 20 facing the carrier 12 may accordingly be configured in an oval or circular fashion. The encapsulating body 20 as a whole may be configured, for example, in a hemispherical, dome-shaped or domed fashion. Afterward, the material of the encapsulating body 20 may be at least partly solidified, for example, dried and/or cured. The encapsulating body 20 may be configured, for example, such that the bond wires and/or the electrical contacts of the carrier 12 are completely or partly surrounded in by the encapsulating body 20 and/or embedded into the encapsulating body 20.

Afterward, the reflector body 26 may be formed. By way of example, the reflector body 26 is applied as a layer on an inner wall (not illustrated) of a housing (not illustrated) of the assembly 10, wherein the inner wall of the housing may adjoin the reflector body 26, for example, in a lateral direction. The carrier 12 may, for example, be secured on the housing or be formed by the housing. After at least partial solidification, drying and/or curing of the reflector body 26, the potting material 24 may be formed into the recess formed by the reflector body 26 above the encapsulating body 20 and above the carrier 12.

The potting material 24 may be applied, for example, in a liquid or viscous state, for example, by means of printing, spraying, dropwise application and/or dispensing. The material of the encapsulating body 20 may comprise, for example, a relatively high refractive index. The potting material 24 may comprise, for example, a relatively low refractive index. By way of example, the relatively high refractive index may be higher than the relatively low refractive index.

Figure 2:
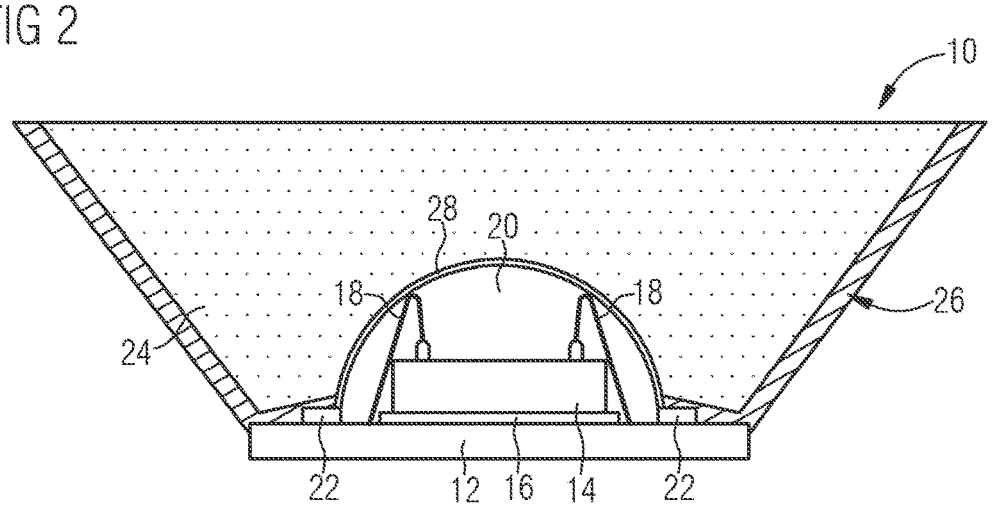
FIG. 2 shows one exemplary embodiment of an electromagnetic radiation-emitting assembly.

FIG. 2 shows one exemplary embodiment of an assembly 10 which may, for example, largely correspond to the assembly 10 explained above. In the case of the assembly 10, the potting material 24 is configured as transparent. The material of the encapsulating body 20 is also configured as transparent. An encapsulating body layer 28 is formed on an outer side of the encapsulating body 20. The encapsulating body layer 28 may serve as a conversion layer and/or comprise phosphor. The encapsulating body layer 28 may be formed, for example, after the process of forming the encapsulating body 20 and before the process of introducing the potting material 24 and/or before the process of forming the reflector body 26. By way of example, the encapsulating body 20 may be sprayed or printed or the encapsulating body layer 28 may be applied by means of dispensing. As an alternative thereto, the material of the encapsulating body layer 28 may firstly be introduced into the liquid or viscous potting material 24. The potting material 24 and process parameters such as, for example, a temperature and/or a viscosity of the potting material 24 may then be predefined such that the material of the encapsulating body layer 28 may settle and/or sediment in the potting material 24 and may settle in particular on the outer side of the encapsulating body 20 and may thus form the encapsulating body layer 28.

Figure 3:
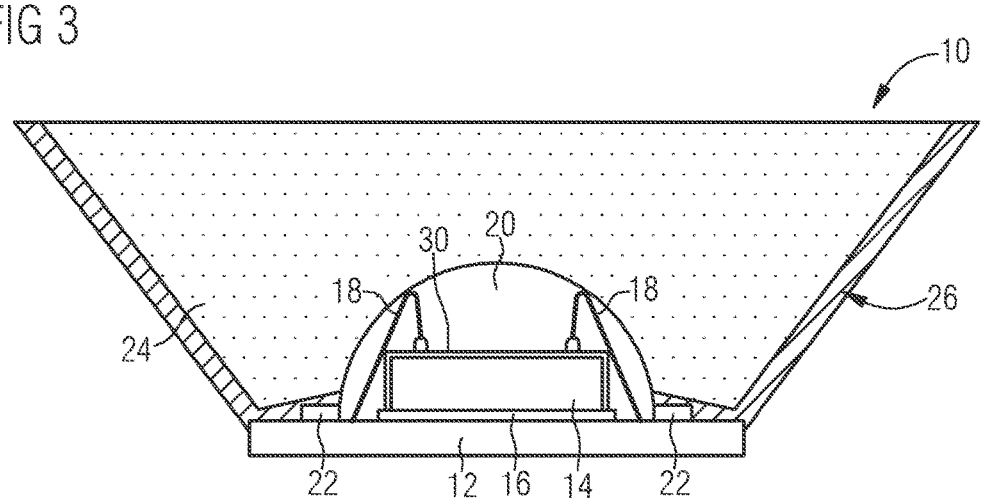
FIG. 3 shows one exemplary embodiment of an electromagnetic radiation-emitting assembly.

FIG. 3 shows one exemplary embodiment of an assembly 10 which may, for example, largely correspond to one of the assemblies 10 explained above. In this exemplary embodiment, the potting material 24 comprises phosphor. Alternatively, the potting material 24 may comprise no phosphor and/or be configured as transparent or translucent. The component 14 comprises a component layer 30, which covers the first side and the side walls of the component 14. The component layer 30 may, for example, comprise phosphor and/or serve as a conversion layer for converting the electromagnetic radiation generated by the component 14. The component layer 30 may be applied on the component 14, for example, by means of spraying and/or lacquering.

If both the component layer 30 and the potting material 24 comprise the phosphor, then a mixture of colored light may thereby be achieved, for example, in a targeted manner. By way of example, the component layer 30 may comprise phosphor that emits red light and the potting material 24 may comprise phosphor that emits green light.

Figure 4:
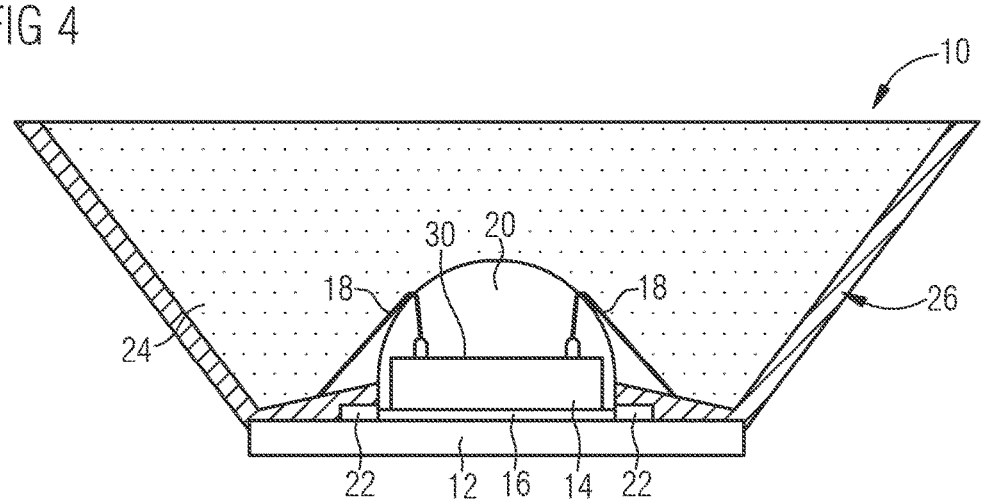
FIG. 4 shows one exemplary embodiment of an electromagnetic radiation-emitting assembly.

FIG. 4 shows one exemplary embodiment of an assembly 10 which may, for example, largely correspond to one of the assemblies 10 explained above. The bond wires 18 are arranged at least partly outside the encapsulating body 20. Alternatively or additionally, the mirror layer 16, the barrier body 22 and/or the reflector body 26 are/is configured such that the carrier 12 is completely covered in a direction toward the component 14 and/or is completely protected from the electromagnetic radiation of the component 14.

The barrier body 22 comprises a height relative to the carrier 12 which, in particular, is lower than the height of the encapsulating body 20. The barrier body 22 is configured in a ring-shaped fashion, for example, and surrounds the component 14. The barrier body 22 may laterally directly adjoin the component 14. If a mirror layer 16 is provided below the component 14, the barrier body 22 may also laterally adjoin the mirror layer 16. The barrier body 22 covers at least one ring-faced partial area of the carrier 12 adjoining the component 14 or adjoining the mirror layer 16. Depending on the embodiment chosen, a remaining part of the surface of the carrier 12 may be covered by the reflector body 26. In addition, the barrier body 22 may also cover a top side of the carrier 12 that is not covered by the component 14 or by the mirror layer 16. As a result, the carrier 12 is protected against the electromagnetic radiation of the component 14.

Depending on the embodiment chosen, the encapsulating body 20 may cover, in addition to the component 14, a partial area of the mirror layer 16 that is not covered by the component 14. In addition, the encapsulating body 20 may also cover a partial area of the barrier body 22 that extends circumferentially around the component 14. Depending on the embodiment chosen, the reflector body 26 may adjoin laterally up to the encapsulating body 20. In addition, the reflector body 26 may either laterally adjoin the barrier body 22 or at least partly cover the barrier body 22.

Figure 5:
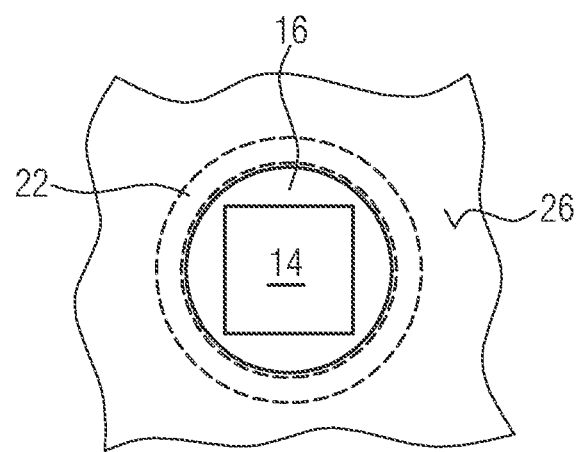
FIG. 5 shows a schematic partial view from above of the exemplary embodiment from FIG. 4 without an encapsulating body.

FIG. 5 shows a view of FIG. 4 from above in a schematic partial view. In this illustration, the encapsulating body 20 is not illustrated, for the sake of a better overview. In addition, the barrier body 22 is arranged on the carrier in a manner extending circumferentially in a ring-shaped fashion and adjoining the mirror layer 16. The barrier body 22 is illustrated by dashed lines. The encapsulating body (not illustrated) is situated within the area surrounded by the barrier body 22, wherein the encapsulating body is arranged on the component and on a partial area of the mirror layer.

The invention is not restricted to the exemplary embodiments indicated. By way of example, the different exemplary embodiments may be combined with one another. By way of example, the encapsulating body layer 28 may be combined with the component layer 30. In other words, the assembly 10 may comprise the component 14 with the component layer 30 and the encapsulating body 20 with the encapsulating body layer 28. Furthermore, phosphor may additionally be arranged in the encapsulating body 20 and/or the potting material 24. Furthermore, two, three or more components 14 may be arranged or embedded in an encapsulating body 20. As an alternative thereto, the assembly 10 may comprise a plurality of components 14 with a corresponding plurality of encapsulating bodies 20. Furthermore, the component 14 may be a surface emitting component. Furthermore, the electrical connections of the component 14 may be configured differently and/or be formed at different locations of the component 14. By way of example, the component 14 may comprise one, two or more electrical connections on its second side or the side walls.

The invention claimed is:

1. An electromagnetic radiation-emitting assembly comprising:
   a carrier;
   an electromagnetic radiation-emitting component arranged above the carrier, the electromagnetic radiation-emitting component comprising a first side facing away from the carrier, a second side facing the carrier, and at least one side wall connecting the first side and the second side of the electromagnetic radiation-emitting component to one another;
   an encapsulating body, into which the electromagnetic radiation-emitting component is embedded, which adjoins the first side and the side wall of the electromagnetic radiation-emitting component, the encapsulating body configured to pass electromagnetic radiation generated by the electromagnetic radiation-emitting component;
   a potting material at least partly surrounding the encapsulating body, the potting material configured to pass the electromagnetic radiation generated by the electromagnetic radiation-emitting component;
   a reflector body at least partly surrounding the potting material, the reflector body configured to reflect the electromagnetic radiation generated by the electromagnetic radiation-emitting component; and
   a barrier body circumventing the electromagnetic radiation-emitting component in a ring-shaped fashion,
   wherein at least one section of the encapsulating body adjoins an inner side of the barrier body in a lateral direction,
   wherein the barrier body comprises a smaller height than the encapsulating body,
   wherein the reflector body adjoins an outer side of the barrier body at least laterally from outside and laterally overlaps the barrier body at least partly from outside and is led from outside over the barrier body as far as the encapsulating body.

2. The electromagnetic radiation-emitting assembly according to claim 1, wherein a circumferential side face of the encapsulating body laterally adjoins the barrier body extending circumferentially around the electromagnetic radiation-emitting component.

3. The electromagnetic radiation-emitting assembly according to claim 1, further comprising a mirror layer arranged between the electromagnetic radiation-emitting component and the carrier, wherein the mirror layer is configured to reflect electromagnetic radiation generated by the electromagnetic radiation-emitting component in a direction away from the carrier.

4. The electromagnetic radiation-emitting assembly according to claim 1, further comprising a barrier body and a mirror layer, wherein the barrier body laterally circumferentially adjoins the electromagnetic radiation-emitting component and/or the mirror layer and covers at least one partial area of a surface of the carrier which extends circumferentially around the electromagnetic radiation-emitting component in a ring-shaped fashion.

5. The electromagnetic radiation-emitting assembly according to claim 3, wherein the mirror layer comprises a reflective adhesion-medium layer, and wherein the reflective adhesion-medium layer secures the electromagnetic radiation-emitting component on the carrier.

6. The electromagnetic radiation-emitting assembly according to claim 1, wherein the encapsulating body comprises a first carrier material and a first filling material, wherein the first filling material is embedded into the first carrier material, and wherein the first filling material comprises phosphor.

7. The electromagnetic radiation-emitting assembly according to claim 1, wherein the potting material comprises a second carrier material and a second filling material, wherein the second filling material is embedded into the second carrier material, and wherein the second filling material comprises phosphor.

8. The electromagnetic radiation-emitting assembly according to claim 1, wherein a minimum distance between the side wall of the electromagnetic radiation-emitting component and the potting material is in a range of between 10 vtrn and 1 mm.

9. The electromagnetic radiation-emitting assembly according to claim 1, wherein the encapsulating body is formed in a domed fashion.

10. The electromagnetic radiation-emitting assembly according to claim 1, wherein the barrier body comprises a reflective material.

11. The electromagnetic radiation-emitting assembly according to claim 1, wherein the electromagnetic radiation-emitting component is a volume emitter.

12. The electromagnetic radiation-emitting assembly according to claim 1, wherein the encapsulating body is coated with an encapsulating body layer.

13. The electromagnetic radiation-emitting assembly according to claim 1, wherein the electromagnetic radiation-emitting component is coated with a component layer.

14. The electromagnetic radiation-emitting assembly according to claim 13, wherein an encapsulating body layer and/or the component layer comprise(s) phosphor.

15. A electromagnetic radiation-emitting assembly comprising:
   a carrier;
   an electromagnetic radiation-emitting component arranged above the carrier, the electromagnetic radiation-emitting component comprises a first side facing away from the carrier, a second side facing the carrier, and at least one side wall connecting the first side and the second side of the electromagnetic radiation-emitting component to one another;
   an encapsulating body, into which the electromagnetic radiation-emitting component is embedded, which adjoins the first side and the side wall of the electromagnetic radiation-emitting component, the encapsulating body configured to pass electromagnetic radiation generated by the electromagnetic radiation-emitting component;
   a potting material surrounding the encapsulating body, the potting material configured to pass the electromagnetic radiation generated by the electromagnetic radiation-emitting component;
   a reflector body surrounding the potting material, the reflector body configured to reflect electromagnetic radiation generated by the electromagnetic radiation-emitting component; and
   a barrier body laterally circumventing the electromagnetic radiation-emitting component, wherein the encapsulating body adjoins the barrier body,
wherein the barrier body comprises a smaller height than the encapsulating body,
wherein the reflector body adjoins the barrier body at least laterally from outside, and
wherein the reflector body covers a surface of the carrier outside the barrier body.

\* \* \* \* \*